(12) United States Patent
Zhang et al.

(10) Patent No.: US 8,850,289 B2
(45) Date of Patent: Sep. 30, 2014

(54) QUALITY BASED PRIORITY DATA PROCESSING WITH SOFT GUARANTEED ITERATION

(75) Inventors: Fan Zhang, Milpitas, CA (US); Kevin G. Christian, Fort Collins, CO (US); Kaitlyn T. Nguyen, San Jose, CA (US); Weijun Tan, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 83 days.

(21) Appl. No.: 13/560,702

(22) Filed: Jul. 27, 2012

(65) Prior Publication Data

US 2014/0033001 A1   Jan. 30, 2014

(51) Int. Cl.
*G11C 29/00* (2006.01)

(52) U.S. Cl.
USPC .............................. 714/763; 714/752; 714/755

(58) Field of Classification Search
USPC .................... 714/763, 755, 704, 752, 799, 54
See application file for complete search history.

(56) References Cited

U.S. PATENT DOCUMENTS

| 6,188,791 | B1 * | 2/2001 | Takizawa ...................... 382/232 |
| 7,113,356 | B1 | 9/2006 | Wu |
| 8,564,879 | B1 * | 10/2013 | Eaton et al. .................... 359/350 |
| 2006/0256670 | A1 | 11/2006 | Park |
| 2010/0070837 | A1 * | 3/2010 | Xu et al. ....................... 714/799 |
| 2011/0164669 | A1 | 7/2011 | Mathew |

OTHER PUBLICATIONS

U.S. Appl. No. 13/558,245, filed Jul. 25, 2012, Fan Zhang, Unpublished.
U.S. Appl. No. 13/552,403, filed Jul. 18, 2012, Fan Zhang, Unpublished.
U.S. Appl. No. 13/400,750, filed Feb. 21, 2012, Fan Zhang, Unpublished.
U.S. Appl. No. 13/433,742, filed Mar. 29, 2012, Fan Zhang, Unpublished.
U.S. Appl. No. 13/316,953, filed Dec. 12, 2011, Haitao Xia, Unpublished.
U.S. Appl. No. 13/340,974, filed Dec. 30, 2011, Dan Liu, Unpublished.
U.S. Appl. No. 13/342,240, filed Jan. 3, 2012, Shaohua Yang, Unpublished.
U.S. Appl. No. 13/445,848, filed Apr. 12, 2012, Bruce Wilson, Unpublished.
U.S. Appl. No. 13/251,342, filed Oct. 3, 2011, Haitao Xia, Unpublished.

* cited by examiner

*Primary Examiner* — Fritz Alphonse
(74) *Attorney, Agent, or Firm* — Hamilton DeSanctis & Cha

(57) ABSTRACT

The present inventions are related to systems and methods for data processing, and more particularly to systems and methods for priority based data processing with soft guaranteed global processing iterations.

20 Claims, 4 Drawing Sheets

QUALITY BASED PRIORITY DATA PROCESSING WITH SOFT GUARANTEED ITERATION

BACKGROUND

The present inventions are related to systems and methods for data processing, and more particularly to systems and methods for priority based data processing.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Each data set is given equal priority until a given data set concludes either without errors in which case it is reported, or concludes with errors in which case a retry condition may be triggered. In such a situation processing latency is generally predictable, but is often unacceptably large.

Hence, for at least the aforementioned reasons, there exists a need in the art for advanced systems and methods for data processing.

BRIEF SUMMARY

The present inventions are related to systems and methods for data processing, and more particularly to systems and methods for priority based data processing with soft guaranteed iterations. In some embodiments, a data processing system includes an input buffer operable to maintain a number of data sets or sectors, a data detector circuit operable to apply a data detection algorithm to the plurality of data sets to yield detected outputs, a memory to store the detected outputs, a data decoder circuit operable to apply a data decode algorithm to a decoder input derived from a selected detected output to yield a decoded output, and a selection circuit operable to select one of the detected outputs in the memory as the selected detected output. The selection circuit produces the selected detected output based at least in part on a number of iterations through the data detector circuit and the data decoder circuit performed on the data sets and based at least in part on quality metrics associated with the data sets. The selection circuit thus guarantees that each data set to be processed in the data processing system receives at least a minimum number of global iterations before concentrating on higher quality data sets, processing good sectors before noisier sectors.

This summary provides only a general outline of some embodiments of the inventions. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for priority based data processing with soft guaranteed iterations.

Various embodiments of the present inventions provide for data processing that includes prioritizing processing data sets based upon one or more quality metrics associated with the respective data sets, and providing a soft guarantee of a particular number of processing iterations. As an example, a data processing system having a quality based priority scheduling circuit may include a data decoder circuit and a data detector circuit. When selecting a data set for processing by the data decoder circuit, the number of errors remaining after a preceding decode of the data set may be used to select which data set is processed next. When a data set is selected for processing by the data detector circuit, the number of errors remaining after a preceding decode of the data set and/or an error value associated with a newly received data set may be used to select which data set is processed next. In some cases, the higher quality data set is chosen to be processed first to assure the lowest average latency across a number of data sets. However, this may cause processing of data sets with a relatively high number of errors in the first decoding iteration to then be delayed until they are kicked out of the system to free up memory, without performing a subsequent processing iteration. Thus, a data set with poor quality might be kicked out after only one global processing iteration.

The data processing system with soft guaranteed iterations includes scheduling rules that attempt to guarantee a particular number of global processing iterations even for low quality data. If any data set has not been processed with the guaranteed number of iterations, it is assigned the highest priority for the data decoder to process. Thus, a soft guarantee is provided that each data set will receive a particular number of processing iterations before the quality based priority scheduling moves high quality data sets to the front of the processing line.

Figure 1:
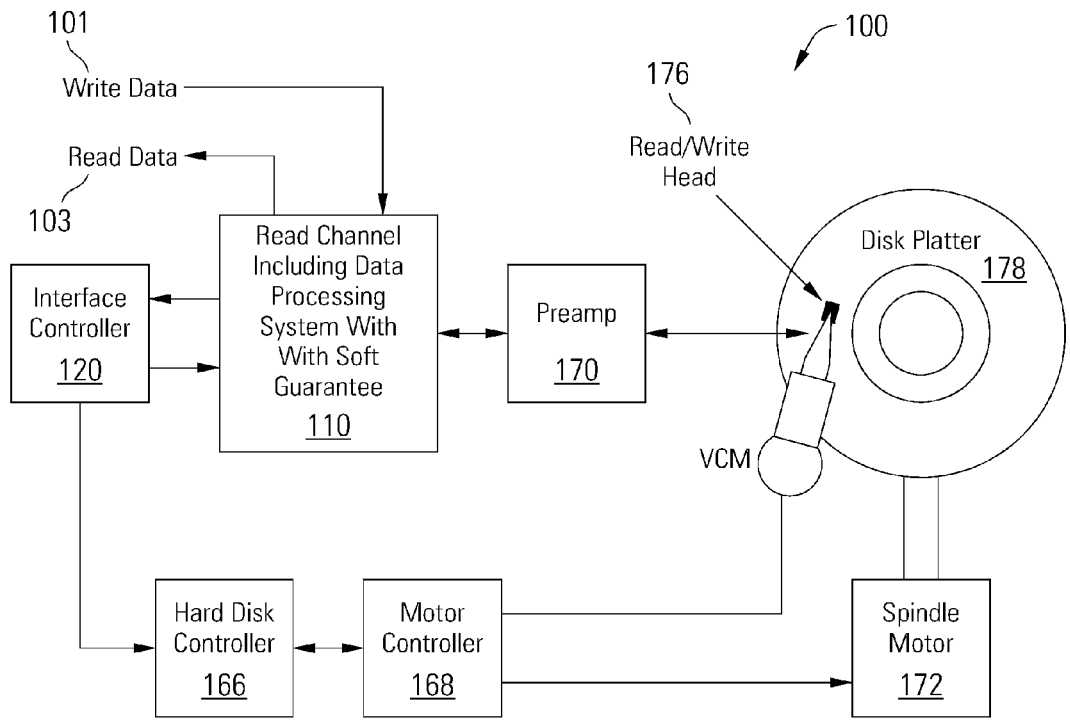
FIG. 1 shows a storage system including quality based priority scheduling circuitry with soft guaranteed iterations in accordance with various embodiments of the present inventions.

Turning to FIG. 1, a storage system 100 including a read channel circuit 110 having quality based priority scheduling circuitry with soft guaranteed iterations is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes quality based priority scheduling circuitry that operates to prioritize application of processing cycles to higher quality codewords over lower quality codewords after providing a soft guarantee of a particular number of processing iterations. Such an approach operates to reduce latency of higher quality codewords and increases latency of lower quality codewords while attempting to guarantee a particular number of processing iterations to all data sets. Where higher quality codewords outnumber lower quality codewords, the average latency of all codewords is reduced. In some cases, read channel circuit 110 may be implemented to include a data processing circuit with soft guarantee similar to that discussed below in relation to FIG. 3. Further, the prioritizing of codeword processing while providing a soft guarantee of processing iterations may be accomplished consistent with one of the approaches discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
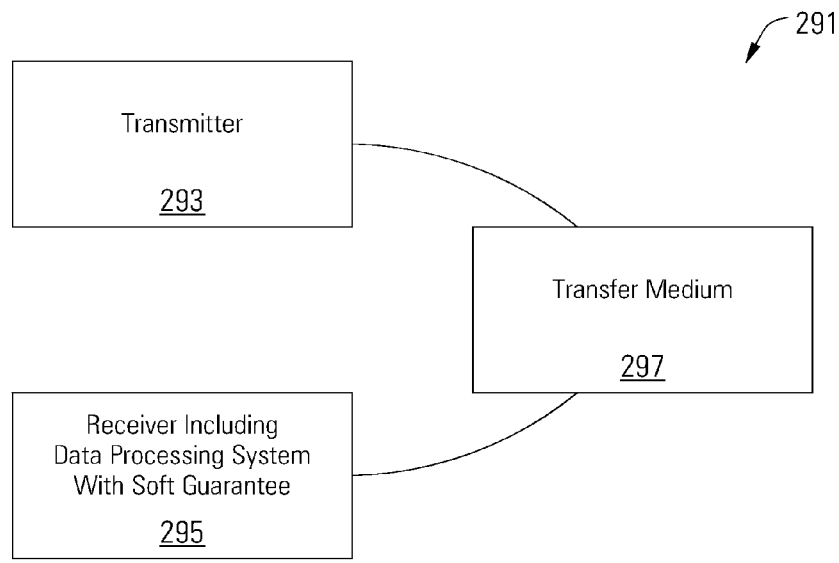
FIG. 2 depicts a data transmission system including quality based priority scheduling circuitry with soft guaranteed iterations in accordance with one or more embodiments of the present inventions.

Turning to FIG. 2, a data transmission system 291 including a receiver 295 having quality based priority scheduling circuitry with soft guaranteed iterations is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. As part of processing the received information, receiver 295 utilizes quality based priority scheduling circuitry that operates to prioritize application of processing cycles to higher quality codewords over lower quality codewords while providing a soft guarantee of a particular number of processing iterations. Such an approach operates to reduce latency of higher quality codewords and increases latency of lower quality codewords. Where higher quality codewords outnumber lower quality codewords, the average latency of all codewords is reduced. In some cases, receiver 295 may be implemented to include a data processing circuit similar to that discussed below in relation to FIG. 3. Further, the prioritizing of codeword processing may be accomplished consistent with one of the approaches discussed below in relation to FIGS. 4a-4b.

Figure 3:
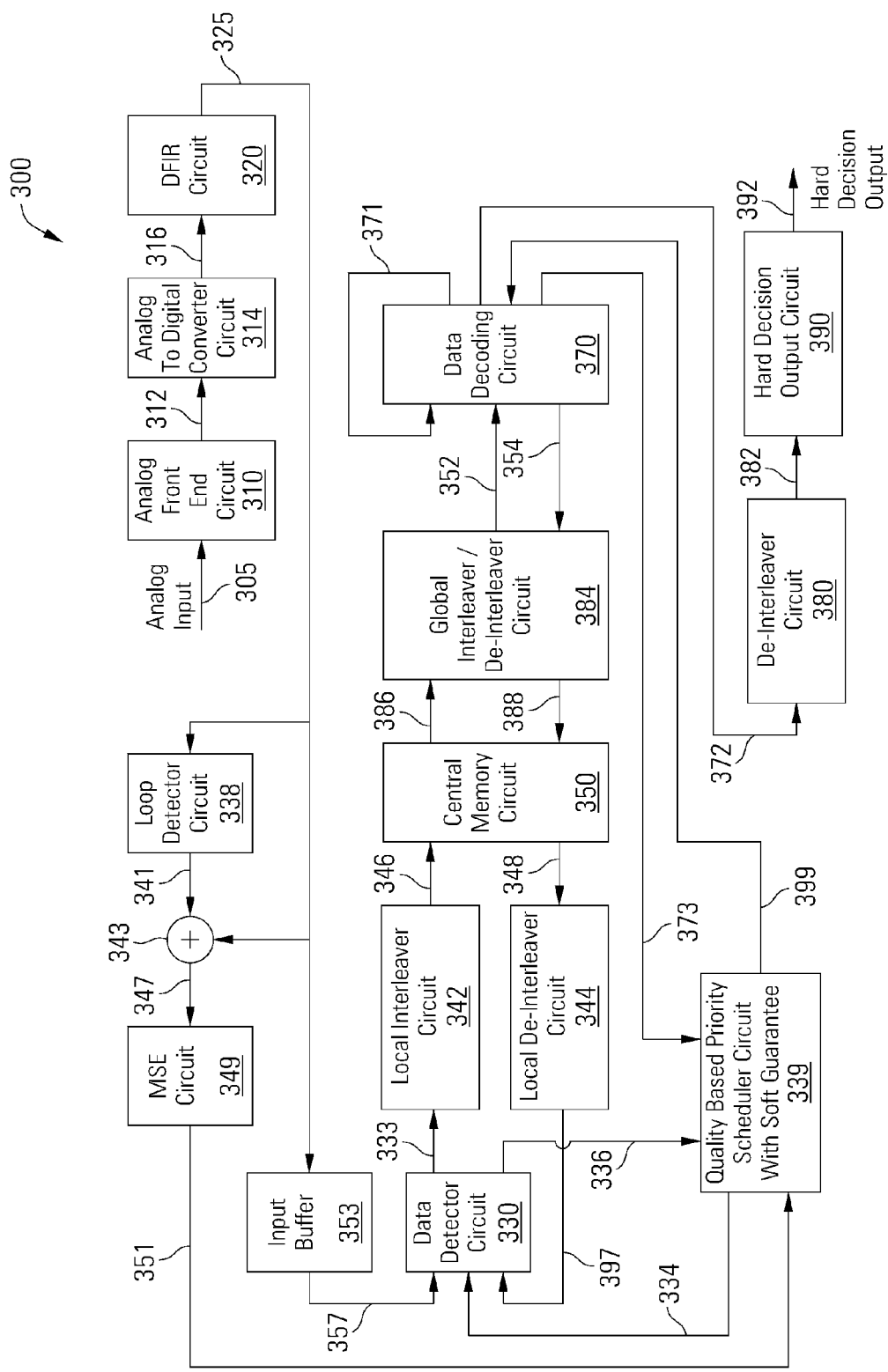
FIG. 3 shows a data processing circuit including a quality based priority scheduler circuit with soft guaranteed iterations in accordance with some embodiments of the present inventions.

FIG. 3 shows a data processing circuit 300 including a quality based priority scheduler circuit with soft guaranteed iterations 339 in accordance with some embodiments of the present invention. The scheduler circuit 339 may also be referred to as a selection circuit, selecting data sets to be processed. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (e.g., 176) that is disposed in relation to a storage medium (e.g., 178). In other cases, analog signal 305 is derived from a receiver circuit (e.g., 295) that is operable to receive a signal from a transmission medium (e.g., 297). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain one or more codewords until processing of that codeword is completed through a data detector circuit 330 and a data decoding circuit 370 including, where warranted, multiple global iterations (processing passes through both data detector circuit 330 and data decoding circuit 370) and/or local iterations (processing passes through data decoding circuit 370 during a given global iteration). The soft guarantee attempts, where possible, to perform at least a minimum number of global processing iterations for all codewords. The minimum number may be predetermined and fixed, or may be programmable, or may be established dynamically based on channel conditions and system performance. An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention.

In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass through data decoder circuit 370) is desired, data decoding circuit 370 re-applies the data decode algorithm to decoder input 352 guided by decoded output 371. This continues until either a maximum number of local iterations is exceeded or decoded output 371 converges.

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

As equalized output 325 is being stored to input buffer 353, a detect quality metric 351 of equalized output 325 is being determined. In particular, equalized output 325 is provided to a loop detector circuit 338 that applies a data detection algorithm to equalized output 325 to yield a detected output 341. In some embodiments of the present invention, loop detector circuit 338 is a simplified version of data detector circuit 330 that is operable to provide detected output 341 as a rough approximation of what detected output 333 will be when data detector circuit 330 applies the data detection algorithm to the same equalized output 325 pulled from input buffer 353. Based upon the disclosure provided herein, one of ordinary skill in the art will recognize a variety of data detector circuits that may be used in relation to different embodiments of the present invention. Detected output 341 is provided to a summation circuit 343 that is operable to subtract equalized output 325 from corresponding instances of detected output 341 to yield a series of error values 347.

Error values 347 are provided to a mean squared error (MSE) calculation circuit 349 that calculates a mean squared error across each codeword received as equalized output 325. The mean squared error value is provided as detect quality metric 351 to quality based priority scheduler circuit 339. In such a case, a higher value of detect quality metric 351 indicates a lower quality. The mean squared error value is calculated in accordance with mean squared error calculations as are known in the art. Alternatively, another error calculation may be used such as, for example, an average error value across the entire codeword. Based upon the disclosure provided herein, one of ordinary skill in the art will recognize a variety of error calculations that may be used in relation to different embodiments of the present invention.

In addition, as codewords are processed through data decoding circuit 370 the number of remaining unsatisfied checks (i.e., the number of parity equations that could not be satisfied by the decoding algorithm) or errors in the codeword are reported to quality based priority scheduler circuit 339 as a decode quality metric 373. The higher the number reported as decode quality metric 373 indicates a lower quality.

Quality based priority scheduler circuit 339 uses detect quality metric 351 and decode quality metric 373 to select the next codeword to be processed by data detector circuit 330 when it becomes available. In particular, the next codeword is either a previously unprocessed codeword from input buffer 353 that is processed by data detector circuit 330 without guidance from de-interleaved output 397 derived from central memory circuit 350, or a previously processed codeword from input buffer 353 that is processed by data detector circuit 330 with guidance from de-interleaved output 397 derived from central memory circuit 350. The selection is indicated to data detector circuit 330 by a codeword selector output 334.

In one particular embodiment of the present invention, quality based priority scheduler circuit 339 selects the next data set to be processed in data detector circuit 330 and in data decoding circuit 350. The quality based priority scheduler circuit 339 selects the next data set based on sector quality metrics and on the number of global processing iterations previously performed for each data set. As disclosed above, data sectors which are in the input buffer 353, but not in the central memory circuit 350, are sorted by the mean squared error provided as detect quality metric 351 by the loop detector circuit 338. Data sectors which are in the central memory circuit 350 are sorted by the decode quality metric 373, which may comprise the number of unsatisfied parity checks calculated for each data sector in a previous decoding iteration in the data decoding circuit 370. In other embodiments, the decode quality metric 373 may comprise the number of errors remaining after application of the data decode algorithm in the data decoding circuit 370. Again, in both these examples, a smaller metric indicates a better data sector, or a data sector with fewer errors.

The quality based priority scheduler circuit 339 generates a codeword selector output 334 identifying the next data sector to be processed by data detector circuit 330, based on detector scheduling rules. The quality based priority scheduler circuit 339 also generates a codeword selector output 399 identifying the next data sector to be processed by data decoding circuit 370, based on decoder scheduling rules.

The detector scheduling rules implemented in some embodiments of the quality based priority scheduler circuit 339 cause data detector circuit 330 to select a previously processed codeword from input buffer 353 that is processed by data detector circuit 330 with guidance from de-interleaved output 397 derived from central memory circuit 350 where a decoded output is available and ready for data detection in central memory circuit 350. In such a case, where at least one decoded output is available and ready for data detection in central memory circuit 350, quality based priority scheduler circuit 339 selects the decoded output to be provided as de-interleaved output 397 that exhibits the lowest value of decode quality metric 373. In other words, if there is at least one data sector ready for the data detector circuit 330 in central memory circuit 350, the quality based priority scheduler circuit 339 selects the best data sector in the data decoding circuit 350 for processing in data detector circuit 330. Alternatively, where no decoded outputs are available and ready for data detection in central memory circuit 350, and there is a free slot for a data sector in data decoding circuit 350 to receive the detector output 333, quality based priority scheduler circuit 339 causes data detector circuit 330 to select a previously unprocessed codeword from input buffer 353. In such a case, where two or more previously unprocessed codewords are available in input buffer 353, quality based priority scheduler circuit 339 selects the codeword to be processed that exhibits the lowest value of detect quality metric 351. Where the data decoding circuit 350 does not have a free slot for a data sector and there are no data sectors ready in data decoding circuit 350 for data detector circuit 330, the data detector circuit 330 will wait until at least one of those conditions occurs.

The decoder scheduling rules implemented in some embodiments of the quality based priority scheduler circuit 339 determine the next codeword to be decoded in data decoding circuit 370, signaling the determination via codeword selector output 399. Where at least one detector output 333 is available in data decoding circuit 350, the highest priority codeword in data decoding circuit 350 is selected to be decoded in data decoding circuit 370. The highest priority codeword in data decoding circuit 350 is identified by quality based priority scheduler circuit 339 as a codeword that has not had the minimum number of global processing iterations to satisfy the soft guarantee. The quality based priority scheduler circuit 339 also considers the decode quality metric 373, which may comprise the number of unsatisfied parity checks calculated for each data sector in a previous decoding iteration in the data decoding circuit 370. For example, if more than one codeword in the data decoding circuit 350 has not had the minimum number of global processing iterations to satisfy the soft guarantee, the quality based priority scheduler circuit 339 selects the one with the lowest value of decode quality metric 373. If all codewords in the data decoding circuit 350 have had the minimum number of global processing iterations, then quality based priority scheduler circuit 339 considers only the decode quality metric 373 when selecting the next codeword to be decoded. If there are no codewords ready in data decoding circuit 350, the data decoding circuit 370 waits until a codeword is available.

Based upon the disclosure provided herein, one of ordinary skill in the art will recognize a variety of other priority algorithms that may be implemented by quality based priority scheduler circuit 339 in accordance with different embodiments of the present inventions.

The guarantee on the number of processing iterations, in some examples of global detection/decoding iterations, is referred to as "soft" because data sets may still be kicked out of the data processing circuit 300 before all data sets have received the minimum number of global iterations, if there is insufficient room in input buffer 353 or central memory circuit 350 when a new data set is read. However, in the absence of this early kick out due to insufficient memory, the quality based priority scheduler circuit 339 ensures that all data sets receive the minimum number of global iterations before focusing processing resources on the highest quality data sets.

In some data processing circuits (e.g., 300), a final global iteration is performed for each data set after it is identified to be kicked out of the system. In these cases, if the minimum number of global iterations to be performed is M, the quality based priority scheduler circuit 339 ensures that all data sets have M−1 global iterations before kickout. In some embodiments, for example, the minimum number of global iterations is set at two, ensuring that the data detector circuit 330 will be guided by the output from data decoding circuit 370 for at least one detection operation during the second global iteration.

By guaranteeing that all data sets receive a minimum number of global iterations, the data processing circuit 300 may not be able to reach a predetermined maximum number of global iterations for every data set before kickout. Thus, by guaranteeing a minimum number of global iterations for every data set, the number of global iterations may be reduced for some data sets. The minimum number M of global iterations may therefore be balanced against the desired number of global iterations performed for better data sets. The number of global iterations performed for each data set may be tracked in any suitable manner, such as with a counter or incrementer in a tracking circuit in the quality based priority scheduler circuit 339 or in the data decoding circuit 370, with the count stored for example in the quality based priority scheduler circuit 339 or in the data decoding circuit 350 along with the data set.

Figure 4A:
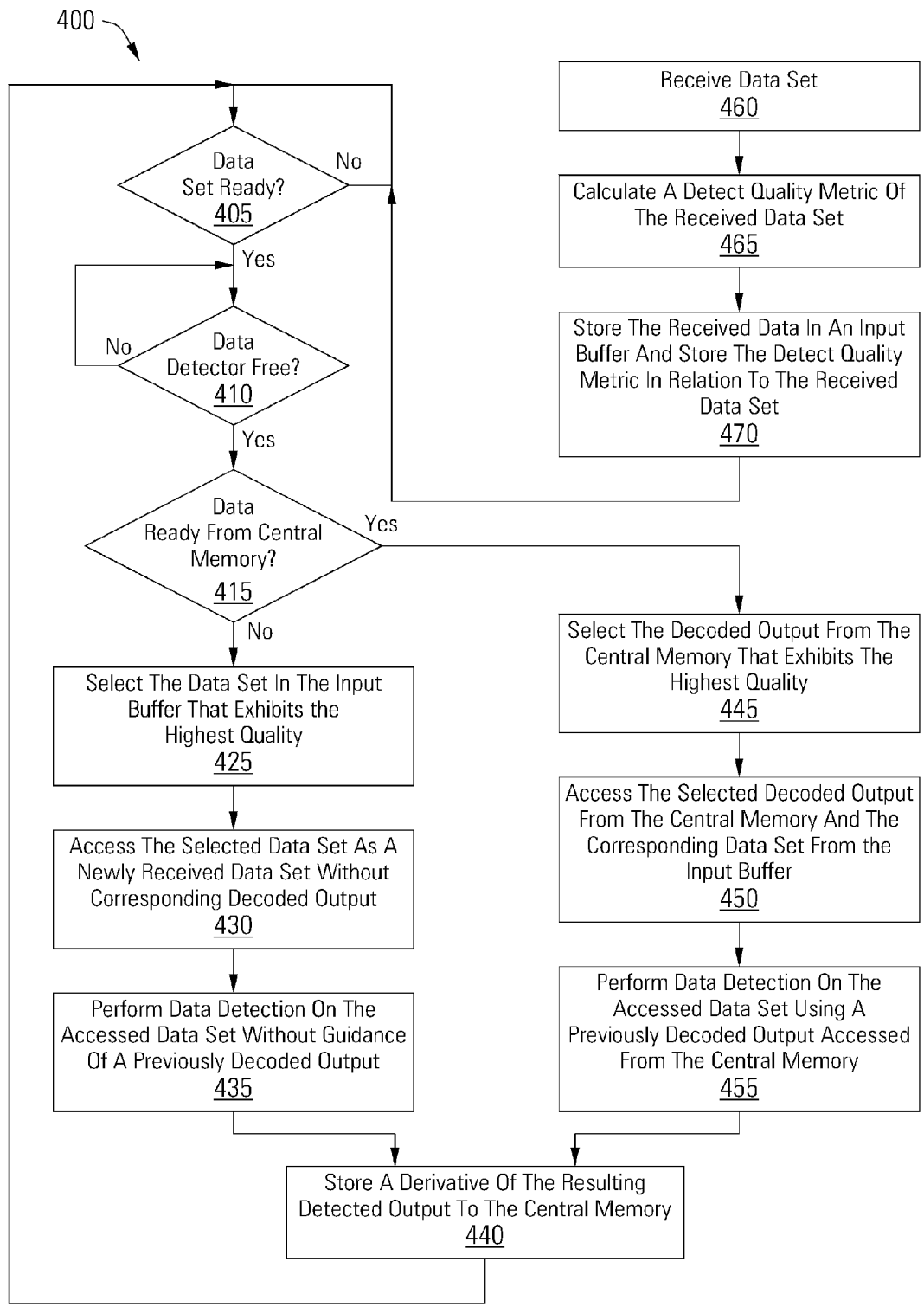
FIGS. 4a-4b are flow diagrams showing a method for quality based priority data processing with soft guaranteed iterations in accordance with some embodiments of the present inventions.

FIG. 4a is a flow diagram 400 showing a method for quality based priority data processing with soft guaranteed iterations in accordance with some embodiments of the present invention, in particular illustrating data detector scheduling rules. Following flow diagram 400 a data set is received (block 460). This data set may be received, for example, from a storage medium or a communication medium. As the data set is received, a detect quality metric is calculated for the data set (block 465). This calculation may include, for example, applying a data detection algorithm or processed to the data set to yield a detected output, and subtracting the detected output from corresponding instances of the received data set to yield an error. The resulting series of errors are then used to calculate a mean squared error value across a number of instances corresponding to a codeword. The mean squared error value is the detect quality metric. Based upon the disclosure provided herein, one of ordinary skill in the art will recognize other priority metrics that may be used in relation to different embodiments of the present invention. The received data set is stored in an input buffer and the detect quality metric is stored in relation to the received data set (block 470).

It is repeatedly determined whether a data set is ready for processing (block 405). A data set may become ready for processing where either the data set was previously processed and a data decode has completed in relation to the data set and the respective decoded output is available in a central memory, or where a previously unprocessed data set becomes available in the input buffer. Where a data set is ready (block 405), it is determined whether a data detector circuit is available to process the data set (block 410).

Where the data detector circuit is available for processing (block 410), it is determined whether there is a decoded output in the central memory that is ready for additional processing (block 415). Where there is not a decoded output in the central memory (block 415), the data set in the input buffer that exhibits the highest quality is selected (block 425). The highest quality is the data set that corresponds to the detect quality metric with the lowest value. In some cases, only one previously unprocessed data set is available in the input buffer. In such cases, the only available data set is selected. The selected data set is accessed from the input buffer (block 430) and a data detection algorithm is applied to the newly received data set (i.e., the first global iteration of the data set) without guidance of a previously decoded output (block 435). In some cases, the data detection algorithm is a Viterbi algorithm data detector circuit or a maximum a posteriori data detector circuit. Application of the data detection algorithm yields a detected output. A derivative of the detected output is stored to the central memory (block 440). The derivative of the detected output may be, for example, an interleaved or shuffled version of the detected output.

Alternatively, where a decoded output is available in the central memory and ready for additional processing (bock 415), the available decoded output in the central memory that exhibits the highest quality is selected (block 445). The highest quality is the decoded output that corresponds to a decode quality metric (see block 441) with the lowest value. In some cases, only one decoded output is available in the central memory. In such cases, the only available decoded output is selected. The data set corresponding to the selected decoded output is accessed from the input buffer and the selected decoded output is accessed from the central memory (block 450), and a data detection algorithm is applied to the data set (i.e., the second or later global iteration of the data set) using the accessed decoded output as guidance (block 455). Application of the data detection algorithm yields a detected output. A derivative of the detected output is stored to the central memory (block 440). The derivative of the detected output may be, for example, an interleaved or shuffled version of the detected output.

Figure 4B:
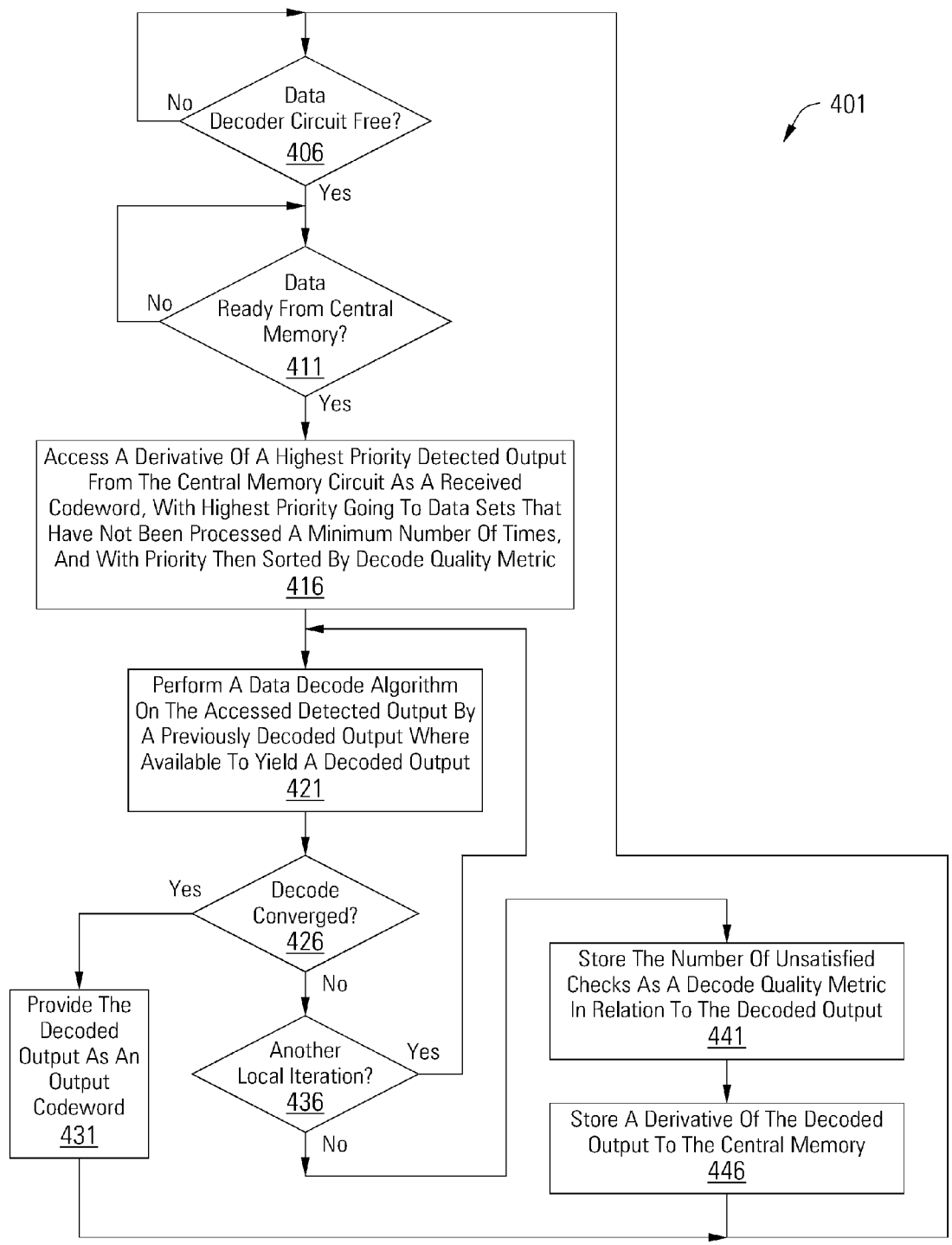

Turning to FIG. 4b, a flow diagram 401 shows a counterpart of the method described above in relation to FIG. 4a, in particular illustrating data decoder scheduling rules. Following flow diagram 401, in parallel to the previously described data detection process of FIG. 4a, it is determined whether a data decoder circuit is available (block 406). The data decoder circuit may be, for example, a low density parity check data decoder circuit as are known in the art. Where the data decoder circuit is available (block 406), it is determined whether a derivative of a detected output is available for processing in the central memory (block 411). (Such a derivative of a detected output may be, but is not limited to, a data detector output that has been locally and globally interleaved.) Where such a data set is ready (block 411), the previously stored derivative of the highest priority detected output in the central memory is accessed and used as a received codeword, with highest priority going to data sets that have not been processed a minimum number of times, and with priority then sorted by decode quality metric (block 416).

A data decode algorithm is applied to the received codeword to yield a decoded output (block 421). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 426). Where the decoded output converged (block 426), it is provided as an output codeword (block 431). Alternatively, where the decoded output failed to converge (block 426), it is determined whether another local iteration is desired (block 436). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 436), the processes of blocks 406-436 are repeated for the codeword. Alternatively, where another local iteration is not desired (block 436), the number of unsatisfied checks are stored as the decode quality metric in relation to the decoded output (block 441), and a derivative of the decoded output is stored to the central memory (block 446). The derivative of the decoded output being stored to the central memory triggers the data set ready query of block 405 to begin the data detection process.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/ or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing with soft guaranteed processing iterations. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
an input buffer operable to maintain a plurality of data sets;
a data detector circuit operable to apply a data detection algorithm to the plurality of data sets to yield detected outputs;
a memory operable to store the detected outputs;
a data decoder circuit operable to apply a data decode algorithm to a decoder input to yield a decoded output; and
a selection circuit operable to select one of the detected outputs in the memory as the decoder input based at least in part on a number of iterations through the data detector circuit and the data decoder circuit performed on the data sets and based at least in part on quality metrics associated with the data sets.

2. The data processing system of claim 1, wherein the quality metrics comprise a number of errors remaining after application of the data decode algorithm in the data decoder circuit.

3. The data processing system of claim 1, wherein the quality metrics comprise a number of unsatisfied parity checks calculated for the data sets as they are processed in the data decoder circuit.

4. The data processing system of claim 1, wherein the selection circuit is operable to assign a highest priority to data sets in the memory for which the number of iterations performed is under a threshold.

5. The data processing system of claim 4, wherein the selection circuit is operable to select one of a plurality of highest priority data sets from the memory based at least in part on the quality metrics for each of the plurality of highest priority data sets.

6. The data processing system of claim 4, wherein the selection circuit is operable to select one of a plurality of lower priority data sets from the memory as the selected data set when none of the highest priority data sets are in the memory, wherein the selection of one of the plurality of lower priority data sets is based at least in part on the quality metrics.

7. The data processing system of claim 1, wherein the selection circuit is operable to prioritize the detected outputs for data sets in the memory first based on whether the number of iterations performed is under a threshold and later based on the quality metrics.

8. The data processing system of claim 1, wherein the data detector circuit is selected from a group consisting of: a Viterbi algorithm data detector circuit, and a maximum a posteriori data detector circuit.

9. The data processing system of claim 1, wherein the data decoder circuit comprises a low density parity check decoder.

10. The data processing system of claim 1, wherein the data processing system is implemented as an integrated circuit.

11. The data processing system of claim 1, wherein the data processing system is incorporated in a storage device.

12. The data processing system of claim 1, wherein the data processing system is incorporated in a storage system comprising a redundant array of independent disks.

13. The data processing system of claim 1, wherein the data processing system is incorporated in a transmission system.

14. A method for data processing, comprising:
applying a data detection algorithm to a plurality of data sets in a data detector circuit to yield detected outputs;
storing the detected outputs in a memory;

applying a data decode algorithm to a decoder input from the memory in a data decoder circuit to yield a decoded output; and selecting one of the detected outputs in the memory as the decoder input based at least in part on a number of iterations through the data detector circuit and the data decoder circuit performed on each of the data sets and based at least in part on quality metrics associated with each of the data sets.

15. The method of claim 14, wherein selecting one of the detected outputs in the memory comprises selecting one of the detected outputs corresponding with one of the data sets for which the number of iterations is less than a threshold.

16. The method of claim 14, wherein when none of the detected outputs in the memory corresponds with one of the data sets for which the number of iterations is less than a threshold, the selecting one of the detected outputs is based on the quality metrics.

17. The method of claim 14, wherein the quality metrics comprise a number of errors remaining after application of the data decode algorithm in the data decoder circuit.

18. The method of claim 14, wherein the quality metrics comprise a number of unsatisfied parity checks calculated for the data sets as they are processed in the data decoder circuit.

19. A storage device comprising:

a storage medium;

a head assembly disposed in relation to the storage medium and operable to provide a sensed signal corresponding to information on the storage medium;

a read channel circuit including:

an analog to digital converter circuit operable to sample an analog signal derived from the sensed signal to yield a series of digital samples;

an equalizer circuit operable to equalize the digital samples to yield a plurality of data sets;

an input buffer operable to maintain the plurality of data sets;

a data detector circuit operable to apply a data detection algorithm to the plurality of data sets to yield detected outputs;

a memory operable to store the detected outputs;

a data decoder circuit operable to apply a data decode algorithm to a decoder input to yield a decoded output; and a selection circuit operable to select one of the detected outputs in the memory as the decoder input based at least in part on a number of iterations through the data detector circuit and the data decoder circuit performed on the data sets and based at least in part on quality metrics associated with the data sets.

20. The storage device of claim 19, wherein the selection circuit is operable to prioritize the detected outputs for data sets in the memory first based on whether the number of iterations performed is under a threshold and later based on the quality metrics.

* * * * *